(12) United States Patent
Linderman

(10) Patent No.: US 9,584,038 B2
(45) Date of Patent: Feb. 28, 2017

(54) UNGROUNDED INVERTER ENCLOSURE AND CABLING

(71) Applicant: Enphase Energy, Inc., Petaluma, CA (US)

(72) Inventor: Ryan Linderman, Oakland, CA (US)

(73) Assignee: Enphase Energy, Inc., Petaluma, CA (US)

(*) Notice: Subject to any disclaimer, the term of this patent is extended or adjusted under 35 U.S.C. 154(b) by 0 days.

(21) Appl. No.: 14/725,720

(22) Filed: May 29, 2015

(65) Prior Publication Data

US 2015/0351264 A1 Dec. 3, 2015

Related U.S. Application Data

(60) Provisional application No. 62/006,608, filed on Jun. 2, 2014.

(51) Int. Cl.
| | | |
|---|---|---|
| H05K 7/20 | (2006.01) | |
| H02M 7/00 | (2006.01) | |
| H05K 7/14 | (2006.01) | |
| H01L 23/473 | (2006.01) | |

(52) U.S. Cl.
CPC .......... *H02M 7/003* (2013.01); *H05K 7/1432* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 7,911,161 B2* | 3/2011 | Ward | ..................... | B60K 6/405 310/54 |
| 2004/0062006 A1* | 4/2004 | Pfeifer | ..................... | F28F 3/12 361/699 |
| 2004/0223304 A1* | 11/2004 | Kobayashi | .......... | B60R 16/0238 361/715 |
| 2006/0039127 A1* | 2/2006 | West | ..................... | H02M 7/003 361/803 |

(Continued)

FOREIGN PATENT DOCUMENTS

| | | |
|---|---|---|
| JP | 08264209 A | 10/1996 |
| KR | 20030084085 A | 11/2003 |
| WO | WO-2010144637 A1 | 12/2010 |

OTHER PUBLICATIONS

International Search Report and Written Opinion mailed Aug. 24, 2015 for PCT Application No. PCT/US2015/033315.

*Primary Examiner* — Anthony Haughton
*Assistant Examiner* — Razmeen Gafur
(74) *Attorney, Agent, or Firm* — Moser Taboada

(57) ABSTRACT

A system and apparatus for power conversion without a connection to ground. In one embodiment, the apparatus comprises an inverter having an enclosure formed from an insulating material, wherein the inverter receives a DC input and generates, from the DC input and without any ground connection, a first AC line voltage carrying output and a second AC line voltage carrying output.

20 Claims, 8 Drawing Sheets

(56) References Cited

U.S. PATENT DOCUMENTS

| | | | | |
|---|---|---|---|---|
| 2006/0092611 A1* | 5/2006 | Beihoff | B60L 11/12 | 361/698 |
| 2006/0274561 A1* | 12/2006 | Ahmed | H02M 7/003 | 363/132 |
| 2008/0007918 A1* | 1/2008 | Lederer | H01L 24/72 | 361/707 |
| 2008/0049477 A1* | 2/2008 | Fujino | H02M 7/003 | 363/131 |
| 2008/0198548 A1* | 8/2008 | Nakamura | H05K 7/20927 | 361/689 |
| 2008/0283118 A1 | 11/2008 | Rotzoll et al. | | |
| 2009/0231811 A1* | 9/2009 | Tokuyama | H01L 23/36 | 361/699 |
| 2009/0295325 A1* | 12/2009 | Sekine | B62D 5/0406 | 318/646 |
| 2010/0097765 A1* | 4/2010 | Suzuki | B60K 6/365 | 361/699 |
| 2010/0238627 A1* | 9/2010 | Shinohara | H01L 23/3107 | 361/695 |
| 2011/0051371 A1* | 3/2011 | Azuma | B60K 6/445 | 361/699 |
| 2012/0106086 A1* | 5/2012 | Schloerke | H01L 25/072 | 361/715 |
| 2012/0162912 A1* | 6/2012 | Kim | H05K 7/20909 | 361/692 |
| 2012/0315787 A1 | 12/2012 | Wiest et al. | | |
| 2013/0077255 A1* | 3/2013 | Abe | H01L 23/36 | 361/716 |
| 2013/0119908 A1* | 5/2013 | Harada | H02P 6/10 | 318/400.42 |
| 2013/0322016 A1* | 12/2013 | Jones | H05K 7/1432 | 361/689 |
| 2014/0168900 A1* | 6/2014 | Korich | H05K 7/1432 | 361/709 |
| 2014/0313671 A1* | 10/2014 | Sugita | H05K 7/20927 | 361/700 |
| 2014/0313673 A1* | 10/2014 | Akamatsu | H05K 7/2039 | 361/706 |
| 2014/0321065 A1* | 10/2014 | Nishimura | H05K 1/0203 | 361/722 |
| 2014/0334102 A1* | 11/2014 | Tanaka | H02M 7/53 | 361/699 |
| 2014/0334105 A1* | 11/2014 | Chen | H05K 7/20509 | 361/714 |

* cited by examiner

US 9,584,038 B2

UNGROUNDED INVERTER ENCLOSURE AND CABLING

CROSS-REFERENCE TO RELATED APPLICATIONS

This application claims benefit of U.S. provisional patent application Ser. No. 62/006,608, entitled "Inverter Enclosure and Cabling" and filed Jun. 2, 2014, which is herein incorporated in its entirety by reference.

BACKGROUND OF THE INVENTION

Field of the Invention

In one type of renewable energy system, photovoltaic (PV) modules are arranged in an array where each module is coupled one-to-one to a DC-AC inverter. The output AC energy is collected from each inverter using a daisy-chain AC cable that couples each inverter to each neighboring inverter, and the AC cable is generally terminated in a junction box to couple the generated AC energy to the power grid. Additionally, the PV system must be grounded to meet relevant safety standards.

Both the AC cabling and grounding for such PV systems incur costs such as materials and time. For example, the AC cable that interconnects the inverters may be custom-made and assembled in the field during the system installation of the PV module array. Such cable assembly is time-consuming, costly and fraught with error. Further, all exposed metal surfaces of the PV system (e.g., PV module metal frames and metal inverter enclosures) must be coupled to ground during the system installation, requiring the appropriate wiring and connections to be made.

Therefore, there is a need in the art for a power conversion system having efficient cabling and does not require any connection to ground.

SUMMARY OF THE INVENTION

Embodiments of the present invention generally relate to a system and apparatus for power conversion without a connection to ground substantially as shown and/or described in connection with at least one of the figures, as set forth more completely in the claims.

Various advantages, aspects and novel features of the present disclosure, as well as details of an illustrated embodiment thereof, will be more fully understood from the following description and drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
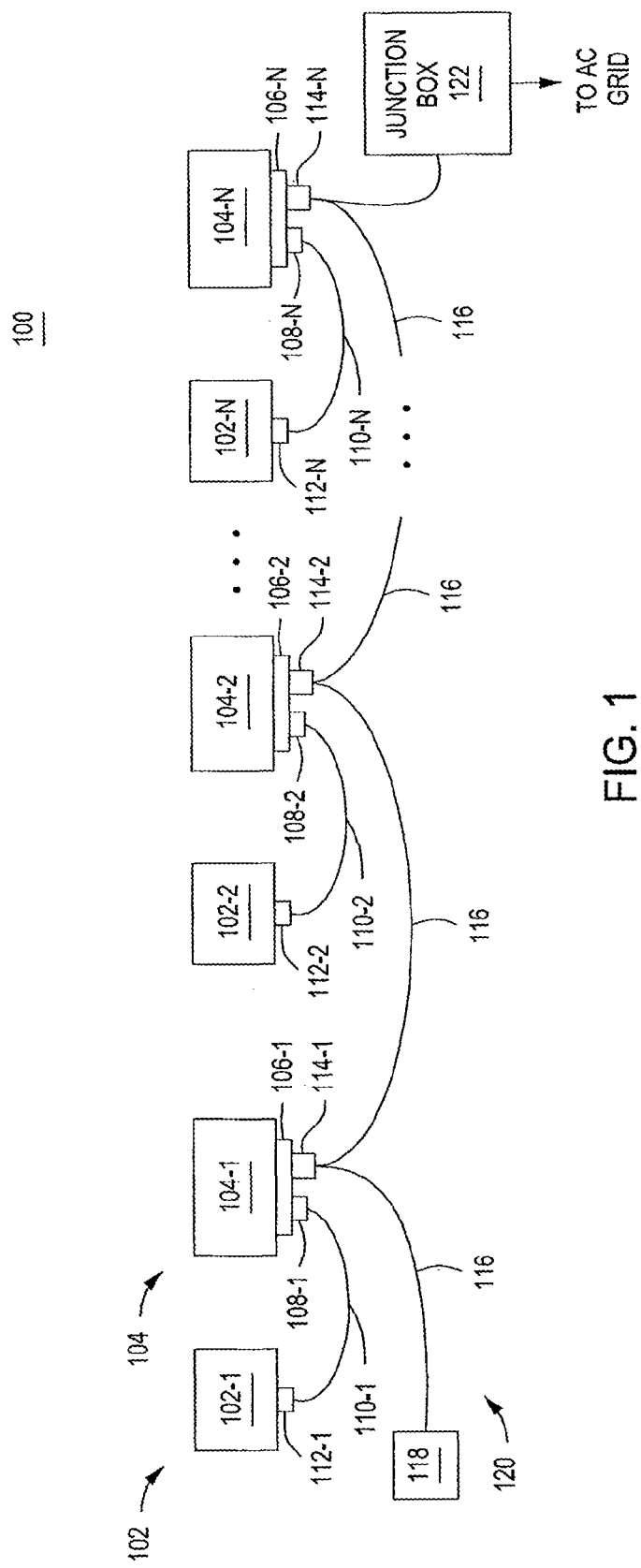
FIG. 1 is a block diagram of a photovoltaic energy system in accordance with one or more embodiments of the present invention.

FIG. 1 is a block diagram of a photovoltaic energy system 100 in accordance with one or more embodiments of the present invention. The system 100 comprises a plurality of photovoltaic (PV) modules 102-1, 102-2, . . . 102-N (collectively referred to as PV modules 102) and a plurality of power conditioning units (PCU), or inverters, 104-1, 104-2, . . . 104-N (collectively referred to as inverters 104). The PV modules 102-1, 102-2, . . . 102-N are coupled to the inverters 104-1, 104-2, . . . 104-N in a one-to-one arrangement by corresponding DC cable assemblies 110-1, 110-2, . . . 110-N (collectively referred to as DC cable assemblies 110) for providing DC power to the inverters 104—i.e., the PV module 102-1 is coupled to the inverter 104-1 by the DC cable assembly 110-1, the PV module 102-2 is coupled to the inverter 104-2 by the DC cable assembly 110-2, and so on. The inverters 104 convert the DC power received from the PV modules 102 to a single-phase AC output power.

Each DC cable assembly 110-1, 110-2, . . . 110-N, comprises a PV interface 112-1, 112-2, . . . 112-N (collectively referred to as PV interfaces 112) and a DC plug 108-1, 108-2, . . . 108-N (collectively referred to an DC plugs 108), respectively, for coupling DC power from the PV modules 102 to the inverters 104. At each PV module 102, the PV interface 112 of a DC cable assembly 110 is coupled to the PV module's DC output, and the DC cable assembly's DC plug 108 is coupled to a bulkhead connector interface assembly 106 of a corresponding inverter 104 for providing the DC power to the inverter 104 (i.e., the DC plug 108-1 is coupled to the inverter 104-1 via the bulkhead connector interface assembly 106-1, the DC plug 108-2 is coupled to the inverter 104-2 via the bulkhead connector interface assembly 106-2, and so on). In some alternative embodiments, one or more of the inverters 104 may be coupled to additional PV modules 102 for receiving DC power from multiple PV modules 102. Additionally or alternatively, one or more of the PV modules 102 may be coupled to multiple inverters 104.

The system 100 further comprises an AC cable assembly 120 that interconnects the inverters 104 to couple the generated AC power to a utility panel or junction box 122 and, ultimately, to an AC grid. In some alternative embodiments, other types of DC power sources may be coupled to one or more of the inverters 104 in addition to or instead of the PV modules 104. Such DC power sources may include batteries, DC-DC power converters, and other types of renewable energy sources such as wind farms, hydroelectric systems, or the like. In general, the AC cable assembly 120 interconnects a plurality of distributed power sources (e.g., an inverter 104 in association with a PV module 102).

The AC cable assembly 120 comprises a plurality of AC trunk splice connectors 114-1, 114-2, . . . 114-N (collectively referred to as AC trunk splice connectors 114) periodically spaced along an AC trunk cable 116. The trunk splice connectors 114-1, 114-2, . . . 114-N are coupled to corresponding inverters 104-1, 104-2, . . . 104-N via the bulkhead interfaces 106-1, 106-2, . . . 106-N, respectively, as described in detail below. The distal end of the AC trunk cable 116 is terminated in a termination cap 118, and the proximal end of the AC trunk cable 116 is coupled to the junction box 122 for coupling the generated AC power to an AC grid, such as a commercial AC power grid.

Figure 7:
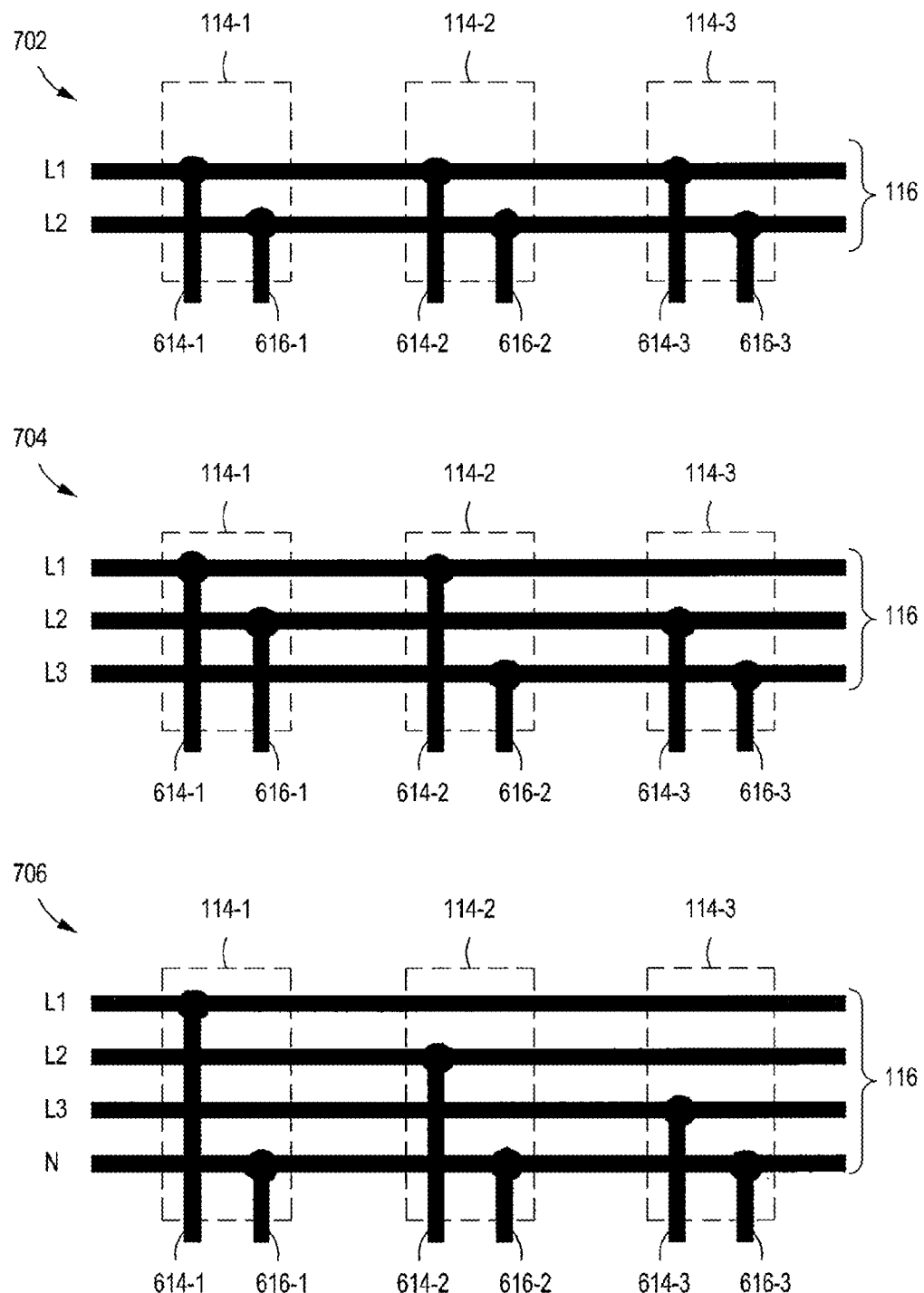
FIG. 7 is a set of diagrams depicting different AC trunk cable phase connection configurations in accordance with one or more embodiments of the present invention.

The AC trunk cable 116 is generally a flat 12AWG 2-wire cable where the AC trunk splice connectors 114 are over-molded Y-splice connectors (as shown in FIG. 7 and described below) that couple the inverters 104 in parallel. The AC trunk cable 116 may be sold as a single cable assembly having a predetermined number of AC trunk splice connectors 114, such as 32 overmolded AC trunk splice connectors 114. Alternatively, the AC trunk cable 116 may be cut to the proper length in the field during installation based on the number of inverters 104 within the array.

The spacing between the AC trunk splice connectors 114 is generally defined based on the dimensions of a PV module, as described below with respect to FIG. 8. In alternative embodiments where other types of DC power sources are used, the spacing between consecutive AC trunk splice connectors 114 may be defined based on the particular type or types of DC power sources used.

In some embodiments, a system controller (not shown) may be coupled to the AC trunk cable 116 for providing operative control of the inverters 104 and/or receiving data from the inverters 104. For example, the system controller may be a gateway that receives data (e.g., performance data) from the inverters 104 and communicates the data and/or other information to a remote device or system, such as a master controller. Additionally or alternatively, the gateway may receive information from a remote device or system, and such information may then be communicated from the gateway to the inverters 104 and/or used to generate control commands that the gateway issues to the inverters 104. In such embodiments comprising a system controller, the system controller and the inverters 104 may communicate using wired techniques (such as power line communications via the AC cable assembly 120) and/or wireless techniques, and the system controller may communicate with a remote device or system, for example via the Internet, by using wired and/or wireless techniques. Such a system controller thus provides remote monitoring capability of the performance of the PV modules 102 and the inverters 104.

In accordance with one or more embodiments of the present invention, the each inverter 104 comprises an enclosure that is formed from an insulating material, for example a blend of polystyrene and polyphenylene ether (PPE) or a polycarbonate (PC) material, such that the inverter 104 does not require any connection to ground. Further, because the inverters 104 each have an enclosure made from an insulating material and a ground wire is not required to the inverters 104, the AC trunk cable 116 only requires two line voltage carrying wires to couple the generated AC power to the AC grid. In other embodiments where one or more of the inverters 104 generates additional AC power phases, the AC trunk cable 116 requires additional wires for carrying the additional phases as well as a neutral line when used, for example split phase with three wires (L1,L2,N), three-phase with three wires (L1,L2,L3) and three-phase line-to-neutral with four wires (L1,L2,L3,N). The AC trunk cable 116 thus requires fewer wires than would be required in systems needing a ground connection, thereby simplifying the AC wiring and reducing costs over systems that require a ground connection.

Figure 2:
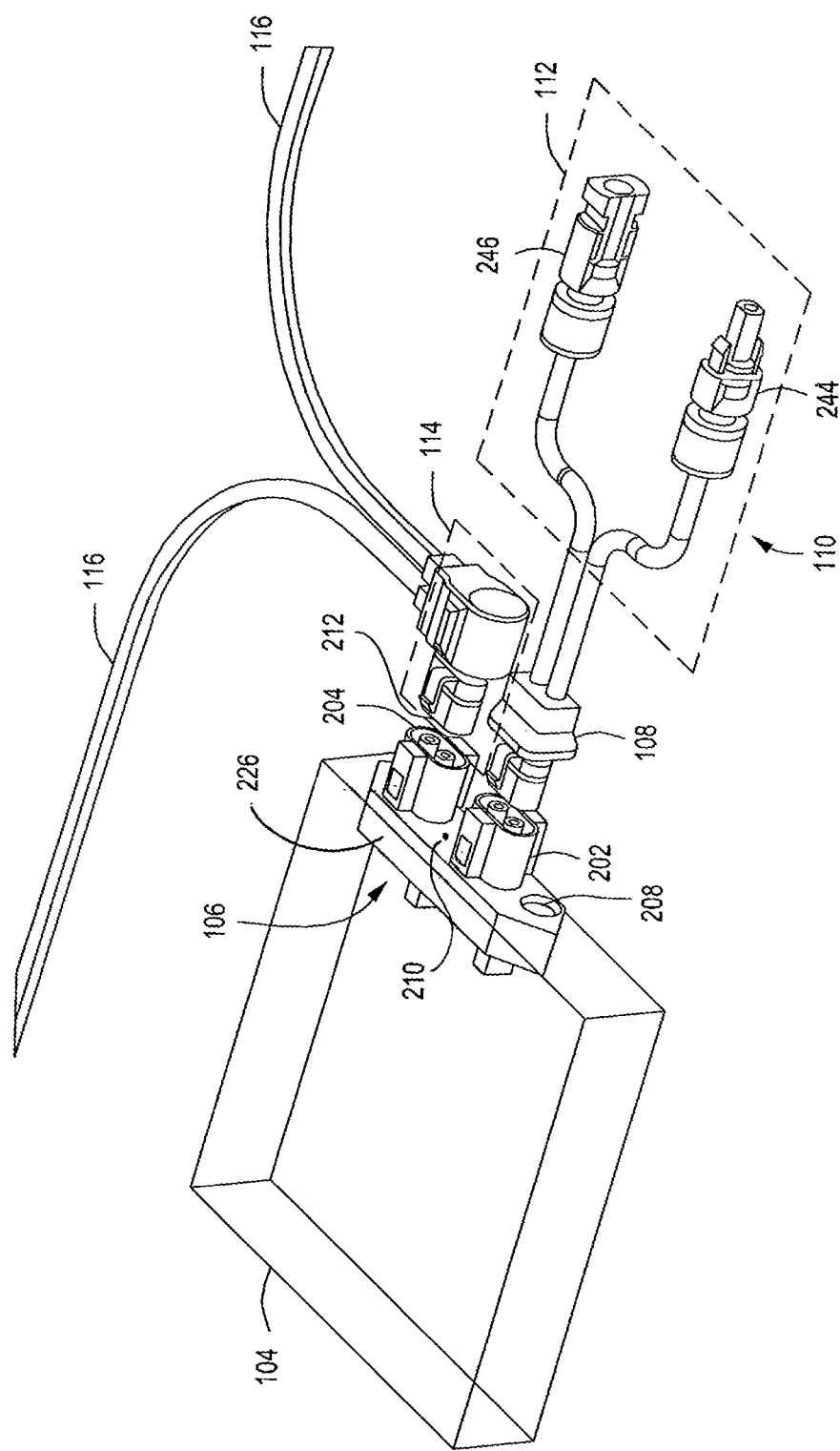
FIG. 2 depicts a side angled perspective view of an inverter, a bulkhead connector interface assembly, a DC cable assembly, and an AC trunk splice connector on a portion of an AC trunk cable in accordance with one or more embodiments of the present invention.

FIG. 2 depicts a side angled perspective view of an inverter 104, a bulkhead connector interface assembly 106, a DC cable assembly 110, and an AC trunk splice connector 114 on a portion of an AC trunk cable 116 in accordance with one or more embodiments of the present invention. In the view depicted in FIG. 2, both the DC plug 108 and the AC trunk splice connector 114 are de-coupled from the inverter 104. Additionally, as depicted in FIG. 2, the exterior walls of the inverter 104 are shown as if transparent and the interior of the inverter 104 is depicted as empty in order to show the rear of the bulkhead connector interface assembly 106 within the inverter enclosure.

The bulkhead connector interface assembly 106, which also may be referred to as the bulkhead assembly 106, is a one-piece overmolded plastic part having metal insert DC and AC bus bars that terminate into the inverter's PCB(s) (not shown); alternatively the bulkhead assembly 106 can be made from contacts assembled into a molded plastic part. The bulkhead assembly 106 is situated on one edge of the inverter 104 and comprises a bulkhead connector interface 226 having a two-terminal AC socket 204 and a two-terminal DC socket 202. In other embodiments, the AC socket 204 may be a three-terminal socket (e.g., for a split-phase three-wire line-to-neutral configuration or a three-phase three-wire line-to-line configuration) or a four-terminal socket (e.g., for a three-phase four-wire line-to-neutral configuration). The AC socket 204 and the DC socket 202 are adapted for coupling to an AC plug 212 of the AC trunk splice connector 114 and to the DC plug 108 of the DC cable assembly 110, respectively.

The bulkhead assembly 106 further comprises a pair of DC bus bars and a pair of AC bus bars, described below with respect to FIG. 4, that are insert-molded to the bulkhead connector interface 226; alternatively, the DC and AC bus bars may be assembled into the bulkhead plastic connector interface 226 after molding. Additionally a small amount of adhesive can be dispensed around the contact to ensure moisture ingress protection. The DC and AC bus bars carry electrical current between one or more printed circuit boards (PCBs) within the inverter 104 (not shown) and the DC and AC sockets 202 and 204, respectively, as described further below.

In some embodiments, the bulkhead connector interface 226 defines a breather port 210 used for conformal coated boards having dead air space inside that needs to "breath" out and in as the air expands and contracts with temperature changes; e.g., a breathing membrane that blocks moisture (for example using GORE-TEX). For fully-potted units the breather port 210 would be a vent hole for air to escape while potting flows into the unit. After potting the hole would be plugged, for example, with a snap-fit plastic plug with an O-ring seal.

The bulkhead connector interface 226 defines a system status light indicator receptacle 208 ("light pipe receptacle 208") that displays a status light (not shown) for indicating one or more status conditions of the inverter 104.

The DC connector assembly 110 comprises the PV interface 112 that couples to the PV module DC output, and the DC plug 108 that couples to the inverter 104 via the DC socket 202. The PV interface 112 comprises PV connectors 244 and 246 that couple to the positive and negative outputs of the PV module 102, e.g., via a junction box on the PV module 102.

Figure 3:
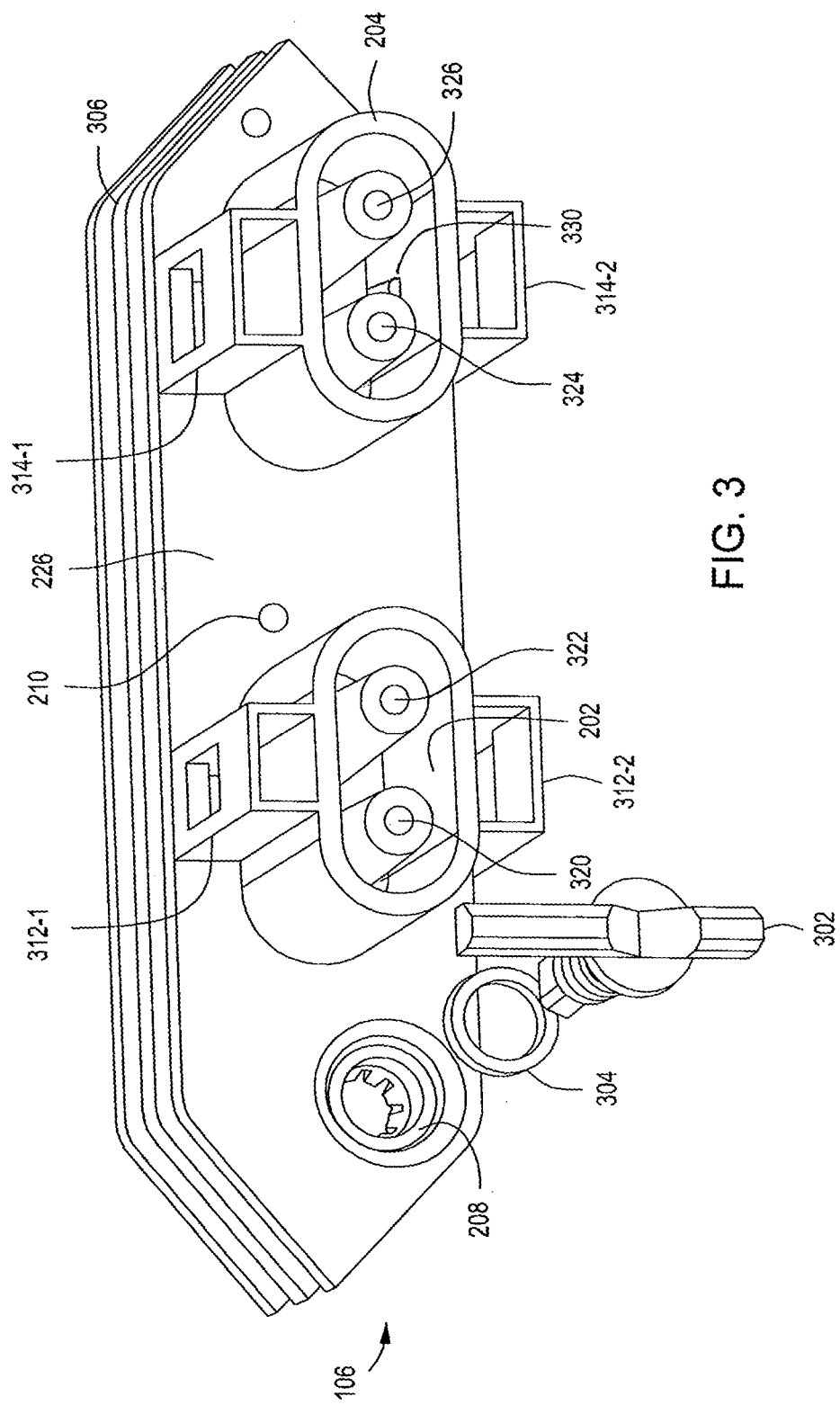
FIG. 3 is an exploded, front angled perspective view of a bulkhead connector interface assembly, an O-ring and a light pipe in accordance with one or more embodiments of the present invention.

FIG. 3 is an exploded, front angled perspective view of a bulkhead assembly 106, an O-ring 304 and a light pipe 302 in accordance with one or more embodiments of the present invention.

The bulkhead connector interface 226 of the bulkhead assembly 106 is formed from an insulating material, such as a blend of polystyrene and polyphenylene ether (PPE) or a polycarbonate (PC) material, or the like. The outer edges of the bulkhead connector interface 226 have a recessed track 306 that allows an adhesive to be dispensed to seal the bulkhead assembly 106 with the remainder of the inverter enclosure.

The bulkhead connector interface 226 comprises the DC socket 202 and the AC socket 204 on its front face. The DC socket 202 is a two-terminal socket, or port, having DC slots 320 and 322 that mate with corresponding electrically-conductive pins (shown in FIG. 5 and described below) of the DC plug 108 for coupling DC power from the PV module 102 to the inverter 104.

The DC socket 202 comprises DC latch receptacles 312-1 and 312-2 (collectively referred to as DC latch receptacles 312) positioned at the top and bottom, respectively, of the DC socket 202. The DC latch receptacles 312 mate with corresponding latch tabs or clips of the DC plug 108, described below with respect to FIG. 5, for mechanically locking the DC plug 108 to the DC socket 202. The DC latch receptacles 312-1 and 312-2 are sized differently from one another to provide a keying feature that prevents the DC plug 108 from being plugged into the DC socket 202 with the incorrect polarity. Although the DC latch receptacles 312 depicted in FIG. 3 are rectangular-shaped, any suitable shape may be used. In some alternative embodiments, the DC plug 108 is overmolded directly into the bulkhead assembly 106 in place of the DC socket 202, for example as described below with respect to FIG. 9.

The AC socket 204 is a two-terminal socket, or port, having AC slots 324 and 326 that mate with corresponding electrically-conductive pins (shown in FIG. 6 and described below) of the AC plug 212 for coupling AC power from the inverter 104 to AC trunk cable 116 and ultimately to the AC grid. The AC socket 204 comprises AC latch receptacles 314-1 and 314-2 (collectively referred to as AC latch receptacles 314) positioned at the top and bottom, respectively, of the AC socket 204. The AC latch receptacles 314 mate with corresponding latch tabs or clips of the AC plug 212, described below with respect to FIG. 6, for mechanically locking the AC plug 212 to the AC socket 204. Because the inverter 104 synchronizes with the line signal to which it is coupled on the AC trunk cable 116, polarity control of the AC plug 212 is not required. Although the AC latch receptacles 314 depicted in FIG. 3 are rectangular-shaped, any suitable shape may be used.

The bulkhead connector interface 226 comprises additional keying features that prevent the DC and AC plugs 108 and 212 from being plugged into the wrong socket. For example, one or both of the DC latch receptacles 312 are configured differently (i.e., sized, shaped, oriented, and/or positioned) from the AC latch receptacles 314 to prevent the DC plug 108 and the AC plug 212 from being plugged into the incorrect socket. Further, the AC socket comprises at least one protuberance 330 on the interior of its sleeve to prevent the DC plug 108 from being plugged into the AC socket 204. One or both of the AC latch receptacles 314 are sized differently from the DC latch receptacles 312 such that the DC plug 108 cannot be plugged into the AC socket 204 and the AC plug 212 cannot be plugged into the DC socket 202.

In other embodiments, any suitable configuration of the DC latch receptacles 312 and the AC latch receptacles 314 (e.g., size, shape, position, orientation, and the like), and/or any suitable placement of protuberances such as the protuberance 330, may be used as keying features to prevent the DC plug 108 from being plugged into the DC socket 202 with the incorrect polarity, to prevent the DC plug 108 from being plugged into the AC socket 204, and/or to prevent the AC plug 212 from being plugged into the DC socket 202.

The light pipe receptacle 208 is sized such that it can receive the light pipe 302 and the O-ring 304 provides a seal between the light pipe receptacle 208 and the light pipe 302. The light pipe 302 may be assembled into the bulkhead assembly 106 using a pressure-sensitive adhesive and a spring locking mechanism. In some alternative embodiments, the light pipe 302 may be directly overmolded into the bulkhead assembly 106.

Figure 4:
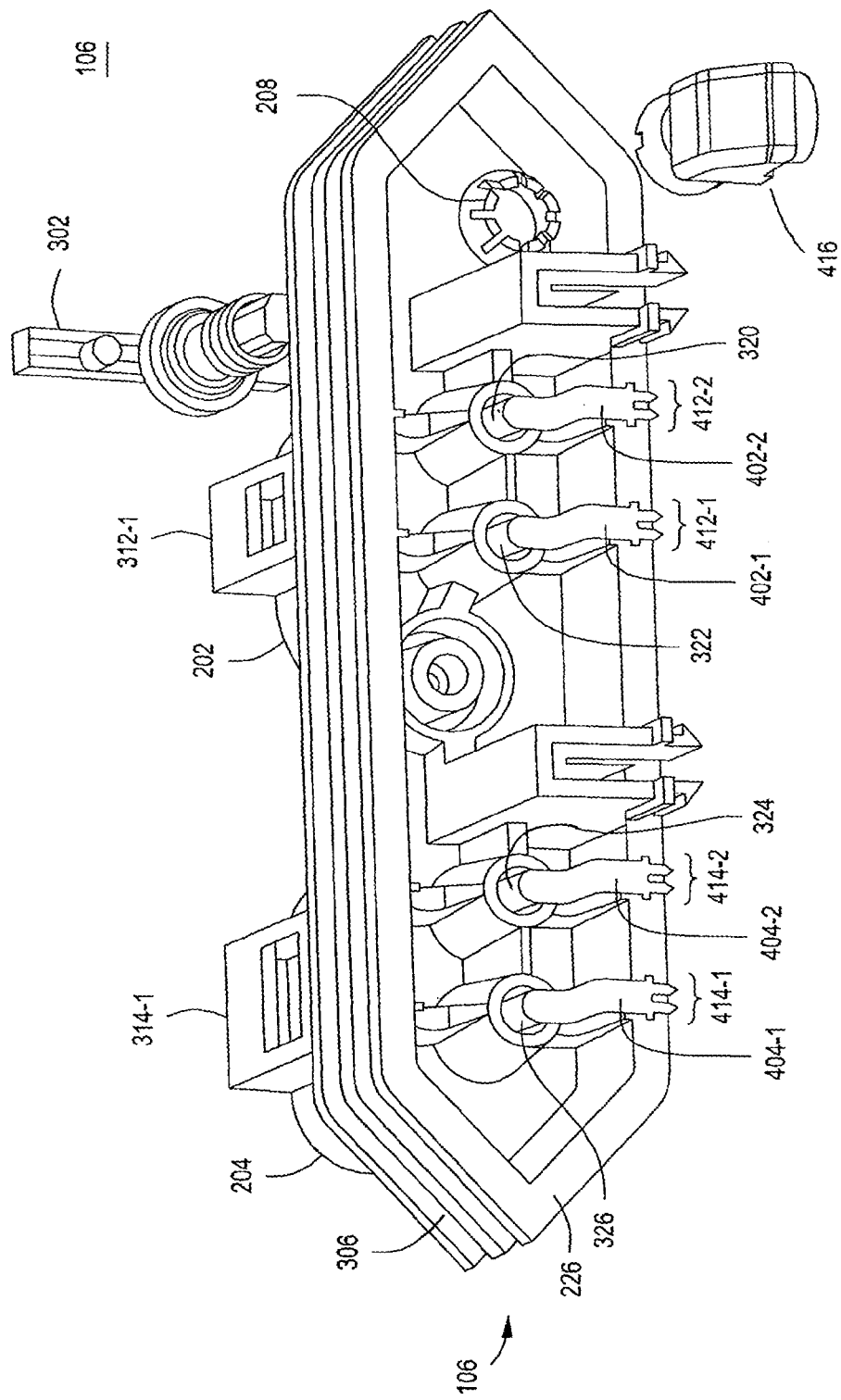
FIG. 4 is an exploded, rear angled perspective view of a bulkhead connector interface assembly.

FIG. 4 is an exploded, rear angled perspective view of a bulkhead assembly 106, a light pipe 302, and a light pipe seal 416 in accordance with one or more embodiments of the present invention. As seen in FIG. 4 and described above, the bulkhead connector interface 226 comprises the DC socket 202 including the DC latch receptacle 312-1, the AC socket 204 including the AC latch receptacle 314-1, and edges having the recessed track 306.

The bulkhead assembly 106 further comprises a pair of metal insert DC bus bars 402-1 and 402-2, collectively referred to as DC bus bars 402, that are insert-molded to the bulkhead connector interface 226 (or, alternatively, assembled into a pre-molded bulkhead connector interface 226 with an adhesive dispense to seal the contacts and prevent moisture ingress into the inverter 104) and extend through the rear of the DC socket 202 to provide electrical connectivity between the DC slots 320 and 322 and one or more PCBs within the inverter 104. The DC bus bars 402-1 and 402-2 terminate in press-pins 412-1 and 412-2, respectively, which are collectively referred to as press-pins 412. The press-pins 412 are press-fit tips on the DC bus bars 402 that provide solder-free fastening (both mechanical and electrical coupling) of the DC bus bars 402 to the DC connectivity points of the inverter's PCB(s) (i.e., the press-pins 412 press-fit to the PCB(s)).

The bulkhead assembly 106 further comprises a pair of metal insert AC bus bars 404-1 and 404-2, collectively referred to as AC bus bars 404, which extend through the rear of the AC socket 204 to providing electrical connectivity between the AC slots 324 and 326 and one or more of the inverter's PCB(s). The AC bus bars 404-1 and 404-2 terminate in press-pins 414-1 and 414-2, respectively, which are collectively referred to as press-pins 414. The press-pins 414 are press-fit tips on the AC bus bars 404 that provide solder-free fastening (both mechanical and electrical coupling) of the AC bus bars 404 to the AC connectivity points of the inverter's PCB(s) (i.e., the press-pins 414 press-fit to the PCB(s)). In other embodiments where the inverter 104 generates two or three AC phases, the bulkhead assembly 106 comprises additional AC bus bars 404, each coupled to a separate additional slot of the AC socket 204, for supporting the additional AC power phases.

In some alternative embodiments, the DC bus bars 402 and/or the AC bus bars 404 terminate in through-hole solder pins (e.g., through-hole solder pins may be welded on the end of the DC bus bars 402 and/or the AC bus bars 404) for through-hole soldering to one or more of the inverter's PCB(s). In some of such embodiments, bus bar extensions may be welded to the insert molded portion of the system in a secondary step after overmolding in order to provide more flexibility for bus bar routing to the PCB(s). The solder pin terminated contacts can alternatively be assembled into a pre-molded connector interface 226 with an adhesive dispense to seal the contacts and prevent moisture ingress into the inverter 104.

As described above, the light pipe 302 is mounted on the front of the bulkhead assembly 106 through the light pipe receptacle 208. The light pipe seal 416 is coupled to the rear of the light pipe 302 and environmentally seals the light pipe receptacle 208. In some embodiments the light pipe 302 is assembled into the bulkhead assembly 106 using a pressure-sensitive adhesive and/or an O-ring seal held under pressure by spring locking mechanisms, such as the light pipe seal 416.

Figure 5:
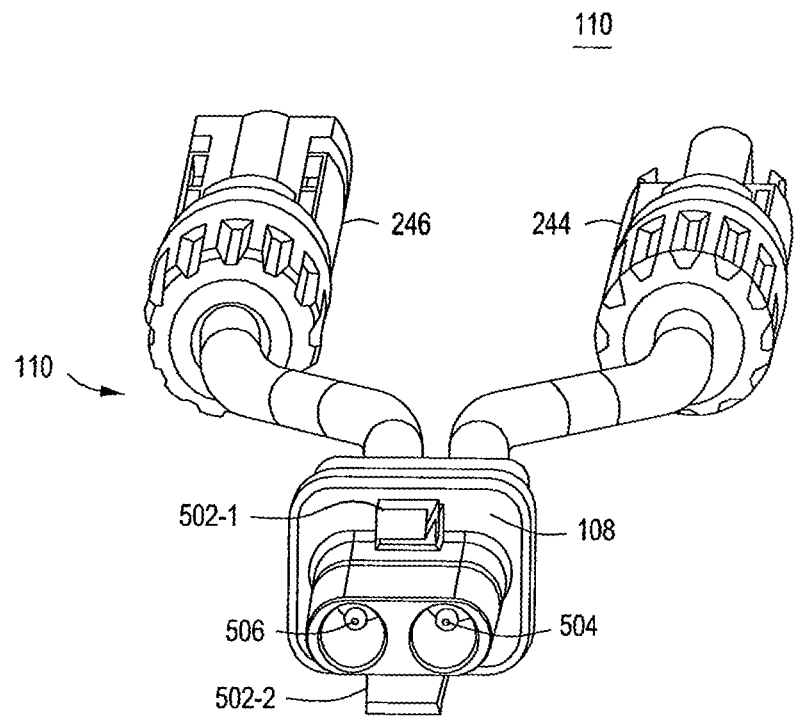
FIG. 5 is an angled perspective view of a DC cable assembly in accordance with one or more embodiments of the present invention.

FIG. 5 is an angled perspective view of a DC cable assembly 110 in accordance with one or more embodiments of the present invention. As previously described, the DC cable assembly 110 comprises the DC plug 108 and the PV connectors 244 and 246. The PV connectors 244 and 246 are configured for coupling to the positive and negative DC terminals, respectively, of the PV module 102 (e.g., the PV connectors 244 and 246 can be coupled to the suitable terminals of a junction box on the PV module 102). In some embodiments, the PV connectors 244 and 246 are multi-contact (MC) connectors that are made of plastic, such as polyphenylene ether (PPE), polycarbonate (PC), NORYL, LEXAN, or the like.

The DC plug 108 comprises DC latch tabs 502-1 and 502-2 (collectively referred to as DC latch tabs 502) positioned at the top and bottom, respectively, of the DC plug 108. The DC latch tabs 502-1 and 502-2 mate with the DC latch receptacles 312-1 and 312-2, respectively, of the DC socket 202 to mechanically lock the DC plug 108 to the DC socket 202. The DC latch tabs 502 are suitably sized, shaped and positioned on the DC plug 108 to mate with the corresponding DC latch receptacles 312 such that the DC plug 108 cannot be plugged into the DC socket 202 with the incorrect polarity. Additionally, the DC latch tabs 502 are suitably sized, shaped and positioned on the DC plug 108 such that they are not compatible with the AC latch receptacles 314 and the DC plug 108 cannot be plugged into the AC socket 204.

The DC plug 108 comprises two electrically-conductive pins 504 and 506 that make electrical contact with the DC bus bars 402 via the DC slots 320 and 322, respectively, when the DC plug 108 is mated with the DC socket 202. The DC pins 504 and 506 are electrically coupled to the PV connectors 244 and 246, respectively, for coupling DC power from the PV module 102 to the inverter 104.

Figure 6:
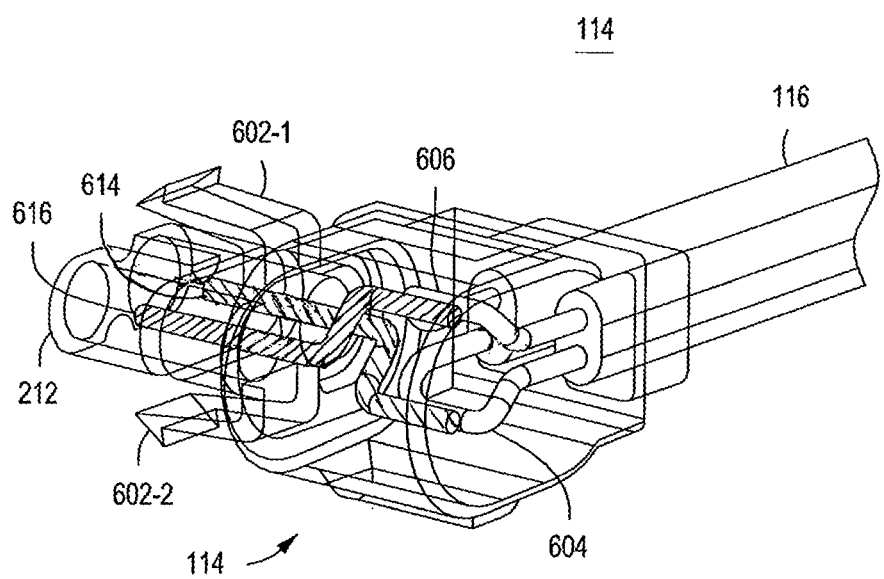
FIG. 6 is an angled perspective view of an AC trunk splice connector in accordance with one or more embodiments of the present invention.

FIG. 6 is an angled perspective view of an AC trunk splice connector 114 in accordance with one or more embodiments of the present invention. As depicted in FIG. 6, the exterior walls of the AC trunk splice connector 114 are shown as if transparent in order to show the electrically conductive components within the AC trunk splice connector 114.

Within the AC trunk splice connector 114, a first conductor 604 (e.g., a first wire) of the AC trunk cable 116 is electrically coupled in a Y-splice configuration to a first AC pin 614 of the AC plug 212, and a second conductor 606 (e.g., a second wire) of the AC trunk cable 116 is electrically coupled Y-splice configuration to a second AC pin 616 of the AC plug 212. The conductors 604 and 606 extend continuously throughout the length of the AC trunk cable 116 and are coupled to the AC grid via the junction box 120. The AC pins 614 and 616 are coupled to the continuous conductors 604 and 606 by, for example, welding or crimping prior to overmolding such that the conductors 604 and 606 are uninterrupted, thereby ensuring a low resistance for the high current in the AC trunk cable 116 from multiple inverters 104 coupled in parallel. In one or more alternative embodiments, pre-cut and stripped wire lengths are utilized with two wire ends crimped to each contact to allow for greater manufacturing flexibility.

The electrically-conductive AC pins 614 and 616 make electrical contact with the AC bus bars 404 via the AC slots 326 and 324, respectively, when the AC plug 212 is mated with the AC socket 204. The AC power generated by the inverter 104 is thus coupled to the AC trunk cable 116 and ultimately to the AC grid.

The AC plug 212 comprises AC latch tabs 602-1 and 602-2 (collectively referred to as AC latch tabs 602) positioned at the top and bottom, respectively, of the AC plug 212. The AC latch tabs 602-1 and 602-2 mate with the AC latch receptacles 314-1 and 314-2, respectively, of the AC socket 204 to mechanically lock the AC plug 212 to the AC socket 204. The AC latch tabs 602 are suitably sized, shaped and positioned on the AC plug 212 to be incompatible with the DC latch receptacles 312 such that the AC plug 212 cannot be plugged into the DC socket 202.

In some alternative embodiments, the AC trunk cable 116 may be a three- or four-wire cable having three or four continuous conductors throughout the length of the AC trunk cable 116. In such embodiments, the AC trunk cable conductors to which the AC pins 614 and 616 are coupled at each AC trunk splice connector 114 may be varied among the AC trunk splice connectors 114. In this way, the pin-out combinations of the AC plug 212 are rotated among the AC trunk splice connectors 114 such that the AC line phases are rotated among the single-phase inverters 104 to generate a multi-phase AC output from the system 100. Examples of such phase rotation are described below with respect to FIG. 7. One example of such a phase rotation may be found in commonly assigned, U.S. Pat. No. 7,855,473 entitled "Apparatus for Phase Rotation for a Three-Phase AC Circuit" and issued Dec. 21, 2010, which is herein incorporated in its entirety by reference.

In other alternative embodiments where the inverters 104 generate two or three phases of AC power, the AC plug 212 comprises additional AC pins and the AC trunk cable 116 may be a three- or four-wire cable having three or four continuous conductors throughout that are each Y-spliced to different AC pins of the AC plug 212. In some of such embodiments, the phase rotation described herein may also be utilized.

FIG. 7 is a set of diagrams 702, 704, and 706 depicting different AC trunk cable phase connection configurations in accordance with one or more embodiments of the present invention.

The diagram 702 depicts a two-wire AC trunk cable 116 comprising continuous conductors L1 and L2. As shown in the diagram 702, the AC pins 614-1, 614-2, and 614-3 of the AC trunk splice connectors 114-1, 114-2, and 114-3 are all electrically coupled to the conductor L1; and the AC pins 616-1, 616-2, and 616-3 of the AC trunk splice connectors 114-1, 114-2, and 114-3 are all electrically coupled to the conductor L2. As a result of such a configuration, a single-phase AC output is generated by the system 100.

The diagram 704 depicts a three-wire AC trunk cable 116 comprising continuous conductors L1, L2 and L3. As shown in the diagram 704, the AC pins 614-1 and 616-1 of the AC trunk splice connector 114-1 are coupled to conductors L1 and L2, respectively; the AC pins 614-2 and 616-2 of the AC trunk splice connector 114-2 are coupled to conductors L1 and L3, respectively; and the AC pins 614-3 and 616-3 of the AC trunk splice connector 114-3 are coupled to conductors L2 and L3, respectively.

The diagram 706 depicts a four-wire AC trunk cable 116 comprising continuous conductors L1, L2, L3 and N. As shown in the diagram 706, the AC pins 614-1 and 616-1 of the AC trunk splice connector 114-1 are coupled to conductors L1 and N, respectively; the AC pins 614-2 and 616-2 of the AC trunk splice connector 114-2 are coupled to conductors L2 and N, respectively; and the AC pins 614-3 and 616-3 of the AC trunk splice connector 114-3 are coupled to conductors L3 and N, respectively. As a result of such a configuration, a three-phase AC output is generated by the system 100.

Figure 8:
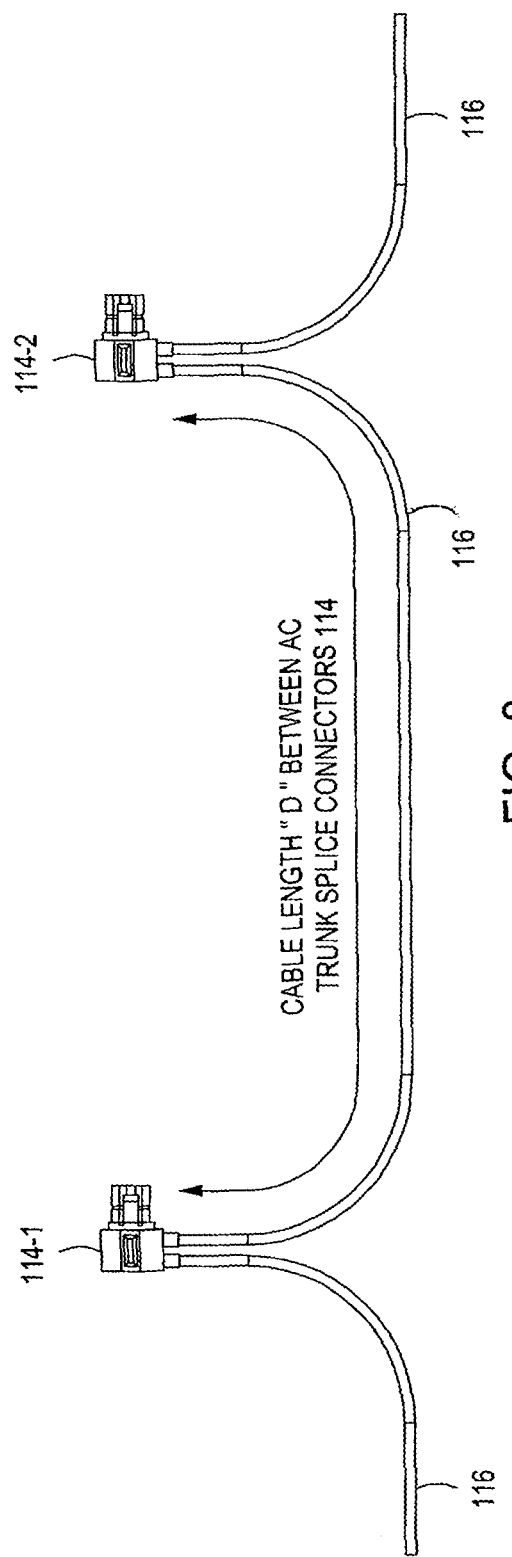
FIG. 8 is side perspective view of two consecutive AC trunk splice connectors along the AC trunk cable in accordance with one or more embodiments of the present invention.

FIG. 8 is side perspective view of two consecutive AC trunk splice connectors 114 along the AC trunk cable 116 in accordance with one or more embodiments of the present invention.

The length "D" of the AC trunk cable 116 between the AC trunk splice connectors 114-1 and 114-2 is generally based on the dimensions of industry-standard PV modules. In certain embodiments, the spacing "D" between consecutive AC trunk splice connectors 114 may be on the order of the width of a single conventional PV module (e.g., on the order of 1.1 m). In some of such embodiments, the PV modules 102 are mounted vertically (i.e., in landscape orientations) and each AC trunk splice connector 114 is coupled to a corresponding inverter 104 (e.g., as depicted in FIG. 1). In other such embodiments, the PV modules 102 are mounted horizontally (i.e., in portrait orientations) such that every other AC trunk splice connector 114 is coupled to an inverter 104 and the unused AC trunk splice connectors 114 are protectively capped or covered. In still other such embodiments, the orientations of the PV modules 102 are mixed (i.e., one or more are vertically orientated while the remaining are horizontally oriented) and any unused AC trunk splice connectors 114 are protectively capped or covered. Thus, a single cable system format can be used in a PV system having any orientation of PV modules 102.

In one or more alternative embodiments, the spacing "D" between consecutive AC trunk splice connectors 114 may be on the order of the height of a single conventional PV module (e.g., on the order of 1.9 m) such that when the PV modules 102 are mounted horizontally (i.e., in portrait orientations) each AC trunk splice connector 114 is coupled to a corresponding inverter 104.

Figure 9:
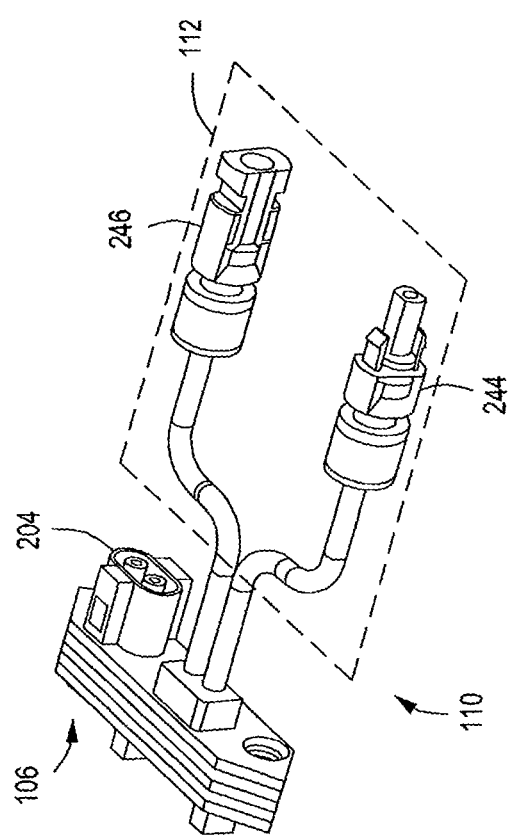
FIG. 9 is a side angled perspective view of a bulkhead connector interface assembly in accordance with one or more alternative embodiments of the present invention.

FIG. 9 is a side angled perspective view of a bulkhead assembly 106 in accordance with one or more alternative embodiments of the present invention. As previously described, the bulkhead assembly 106 depicted in FIG. 9 comprises the AC socket 204. Additionally, the DC cable assembly 110 is overmolded directly into the bulkhead assembly 106 such that it is permanently affixed to the bulkhead assembly 106. In such embodiments, the DC bus bars 402 are insert molded bus bars that are electrically coupled (e.g., crimped or welded) to the wires of the DC cable assembly 110 before overmolding the bulkhead assembly 106. The PV connectors 244 and 246 of the PV interface 112 extend from the overmolded bulkhead assembly 106 for coupling to the DC terminals of the PV module 102.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. An apparatus for power conversion without a connection to ground, comprising:
an inverter having an enclosure formed from an insulating material, wherein the inverter receives a DC input and generates, from the DC input and without any ground connection, a first AC line voltage carrying output and a second AC line voltage carrying output.

2. The apparatus of claim 1, wherein the inverter comprises a bulkhead connector interface comprising a DC port that receives the DC input and an AC port that couples the first and the second AC line voltage carrying outputs to an AC line.

3. The apparatus of claim 2, wherein the inverter comprises (i) a pair of DC bus bars that electrically couple the DC port to at least one printed circuit board (PCB) of the inverter, and (ii) a pair of AC bus bars that electrically couple the AC port to the at least one PCB.

4. The apparatus of claim 3, wherein the pair of DC bus bars have press-pin tips that press-fit to the at least one PCB to electrically couple the DC port to the at least one PCB, and wherein the pair of AC bus bars have press-pin tips that press-fit to the at least one PCB to electrically couple the AC port to the at least one PCB.

5. The apparatus of claim 3, wherein the pair of DC bus bars and the pair of AC bus bars terminate in through-hole solder pins that are through-hole soldered to the at least one PCB to electrically couple the pair of DC bus bars and the pair of AC bus bars to the at least one PCB.

6. The apparatus of claim 3, wherein the pair of DC bus bars and the pair of AC bus bars are insert-molded to the bulkhead connector interface.

7. The apparatus of claim 2, wherein both the DC and the AC ports are two-terminal ports, and wherein the DC and the AC ports comprise at least one keying feature to prevent a DC plug, adapted for being plugged into the DC port, from being plugged into the AC port and to prevent an AC plug, adapted for being plugged into the AC port, from being plugged into the DC port.

8. The apparatus of claim 7, wherein the at least one keying feature further prevents the DC plug from being plugged into the DC port with the wrong polarity.

9. The apparatus of claim 7, wherein the at least one keying feature additionally mechanically locks the DC plug to the DC port and the AC plug to the AC port.

10. A system for power conversion without a connection to ground, comprising:
a plurality of inverters, wherein each inverter of the plurality of inverters (i) has an enclosure formed from an insulating material, and (ii) receives a DC input and generates, from the DC input and without any ground connection, a first AC line voltage carrying output and a second AC line voltage carrying output; and an AC trunk cable assembly comprising an AC trunk cable and a plurality of AC trunk splice connectors spaced along the AC trunk cable, wherein (a) the AC trunk cable comprises first and second conductors extending through the AC trunk cable, and (b) each AC trunk splice connector of the plurality of AC trunk splice connectors is coupled to the first and second conductors and to a different inverter of the plurality of inverters such that the first AC line voltage carrying output is electrically coupled to the first conductor and the second AC line voltage carrying output is electrically coupled to the second conductor.

11. The system of claim 10, wherein the first and the second conductors are each continuous within the AC trunk cable.

12. The system of claim 11, wherein each AC trunk splice connector of the plurality of AC trunk splice connectors comprises first and second AC pins electrically coupled to the first and the second AC line voltage carrying outputs of the corresponding inverter via an AC port of the corresponding inverter, and wherein the first AC pin is electrically coupled to the first conductor by a Y-splice, and wherein the second AC pin is electrically coupled to the second conductor by a Y-splice.

13. The system of claim 12, wherein each AC trunk splice connector of the plurality of AC trunk splice connectors is overmolded to the AC trunk cable.

14. The system of claim 10, wherein each inverter of the plurality of inverters comprises a bulkhead connector interface comprising a DC port that receives the DC input and an AC port that couples the first and the second AC line voltage carrying outputs to an AC line.

15. The system of claim 14, wherein each inverter of the plurality of inverters comprises (i) a pair of DC bus bars that electrically couple the DC port to at least one printed circuit board (PCB) of the inverter, and (ii) a pair of AC bus bars that electrically couple the AC port to the at least one PCB.

16. The system of claim 15, wherein the pair of DC bus bars have press-pin tips that press-fit to the at least one PCB to electrically couple the DC port to the at least one PCB, and wherein the pair of AC bus bars have press-pin tips that press-fit to the at least one PCB to electrically couple the AC port to the at least one PCB.

17. The system of claim 15, wherein the pair of DC bus bars and the pair of AC bus bars terminate in through-hole solder pins that are through-hole soldered to the at least one PCB to electrically couple the pair of DC bus bars and the pair of AC bus bars to the at least one PCBs.

18. The system of claim 15, wherein the pair of DC bus bars and the pair of AC bus bars are insert-molded to the bulkhead connector interface.

19. The system of claim 14, wherein both the DC and the AC ports are two-terminal ports, and wherein the DC and the AC ports comprise at least one keying feature to prevent a DC plug, adapted for being plugged into the DC port, from being plugged into the AC port and to prevent an AC plug, adapted for being plugged into the AC port, from being plugged into the DC port.

20. The system of claim 19, wherein the at least one keying feature further prevents the DC plug from being plugged into the DC port with the wrong polarity.

* * * * *